(12) United States Patent
Funakubo

(10) Patent No.: US 7,061,159 B2
(45) Date of Patent: Jun. 13, 2006

(54) ULTRASONIC TRANSDUCER AND ULTRASONIC MOTOR

(75) Inventor: Tomoki Funakubo, Hachioji (JP)

(73) Assignee: Olympus Corporation, Tokyo (JP)

( * ) Notice: Subject to any disclaimer, the term of this patent is extended or adjusted under 35 U.S.C. 154(b) by 148 days.

(21) Appl. No.: 10/785,807

(22) Filed: Feb. 24, 2004

(65) Prior Publication Data

US 2004/0178700 A1    Sep. 16, 2004

(30) Foreign Application Priority Data

Mar. 13, 2003   (JP)   ............................. 2003-068452

(51) Int. Cl.
*H01L 41/08* (2006.01)

(52) U.S. Cl. ............................ 310/323.12; 310/323.02; 310/328

(58) Field of Classification Search ........... 310/323.02, 310/323.12, 323.16, 328, 366
See application file for complete search history.

(56) References Cited

U.S. PATENT DOCUMENTS 5,345,137 A * 9/1994 Funakubo et al. ..... 310/323.16
6,084,335 A * 7/2000 Tamai ................... 310/316.02
6,404,104 B1 * 6/2002 Maeno et al. .......... 310/323.02

FOREIGN PATENT DOCUMENTS

JP          5-146171         6/1993

\* cited by examiner

*Primary Examiner*—Mark Budd
(74) *Attorney, Agent, or Firm*—Scully, Scott, Murphy & Presser, P.C.

(57) ABSTRACT

An ultrasonic transducer in which internal electrodes and piezoelectric elements are alternately layered includes outer electrodes, each being connected to the corresponding internal electrodes. The ultrasonic transducer has a first layered part, a second layered part, a first outer-electrode group, and a second outer-electrode group. The first layered part includes at least the internal electrodes, each being divided in half in a second direction orthogonal to a layering direction, which is a first direction. The second layered part includes at least the internal electrodes, each being divided in half in a third direction orthogonal to the first direction and the second direction. The first outer-electrode group is provided so as to be connected to predetermined internal electrodes in the first layered part. The second outer-electrode group is provided so as to be connected to predetermined internal electrodes in the second layered part.

18 Claims, 13 Drawing Sheets

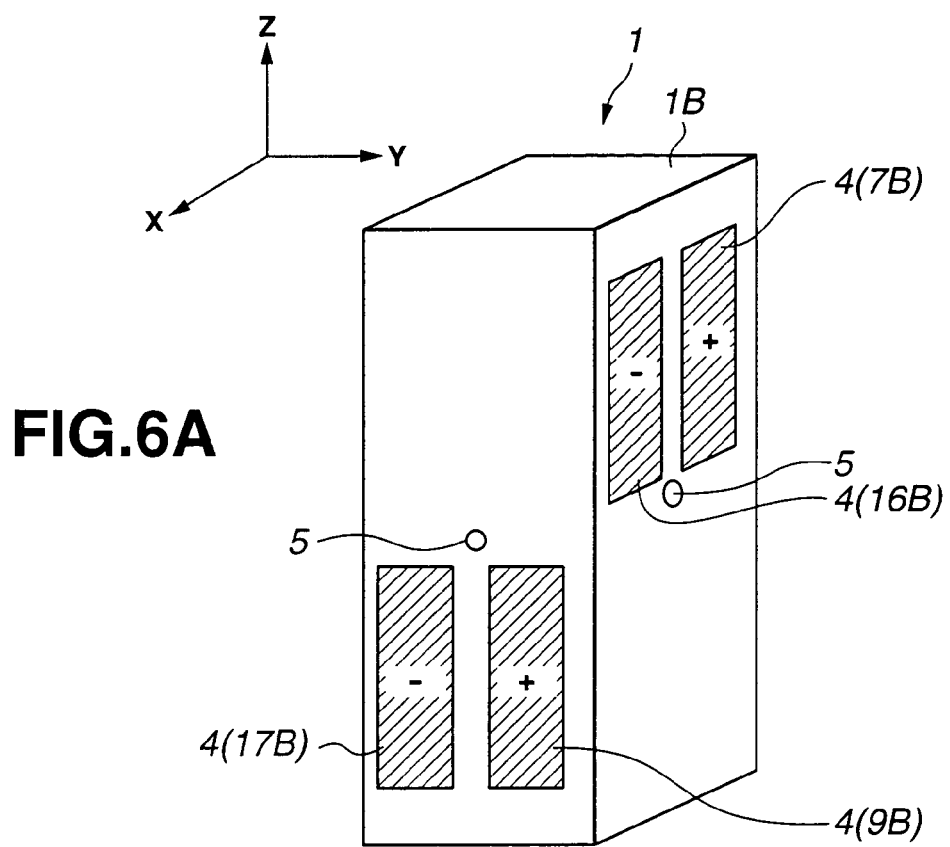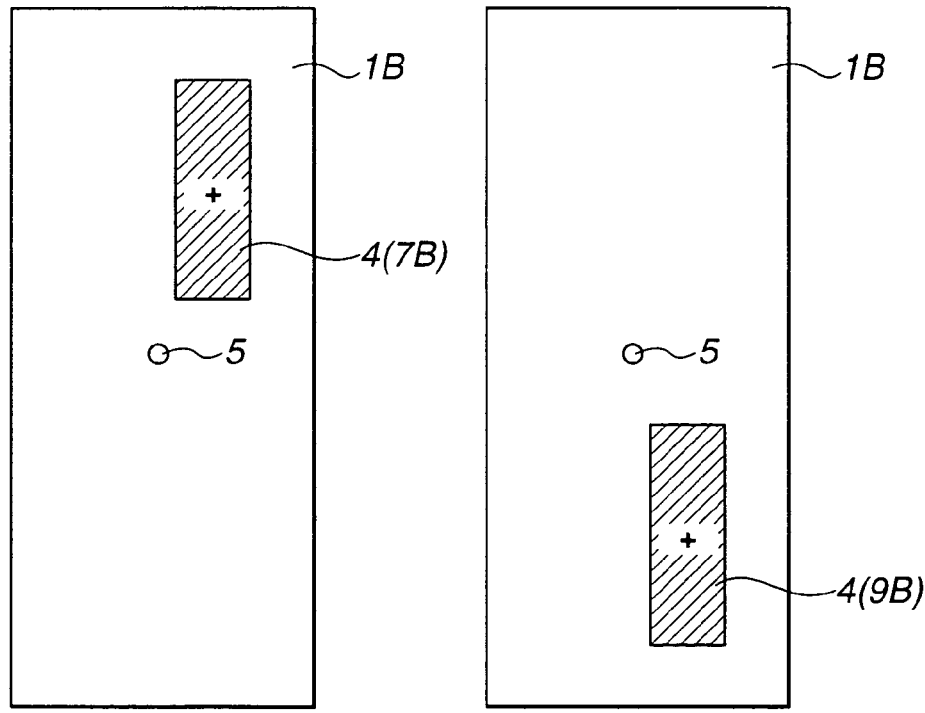
FIG.6A
FIG.6B  FIG.6C

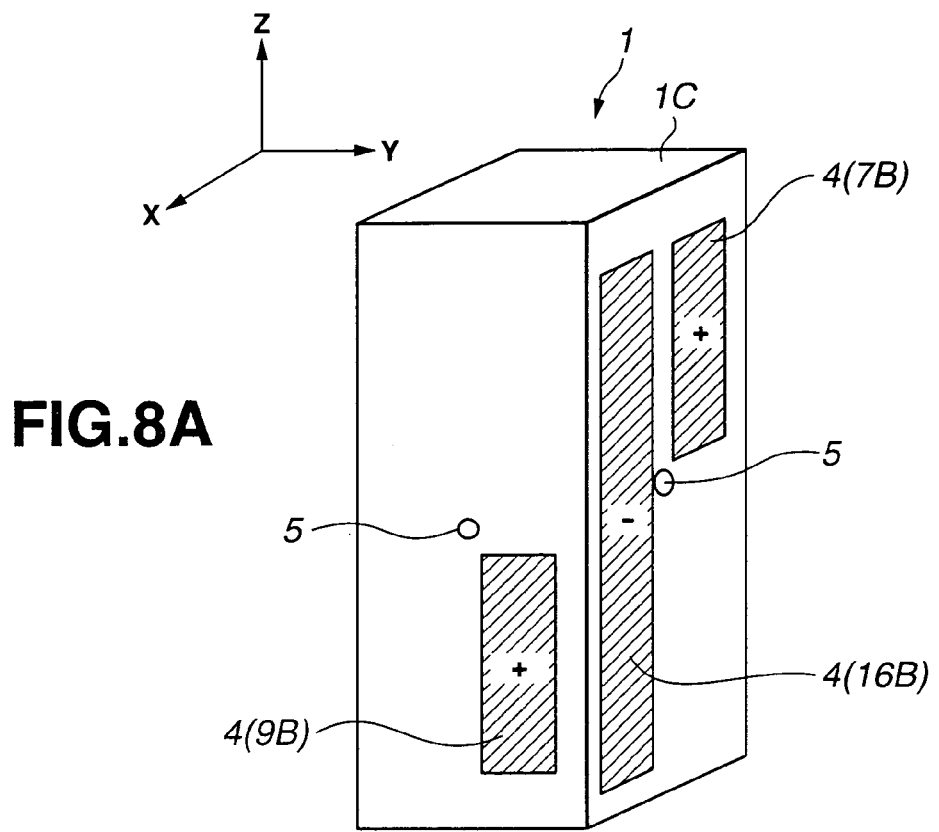
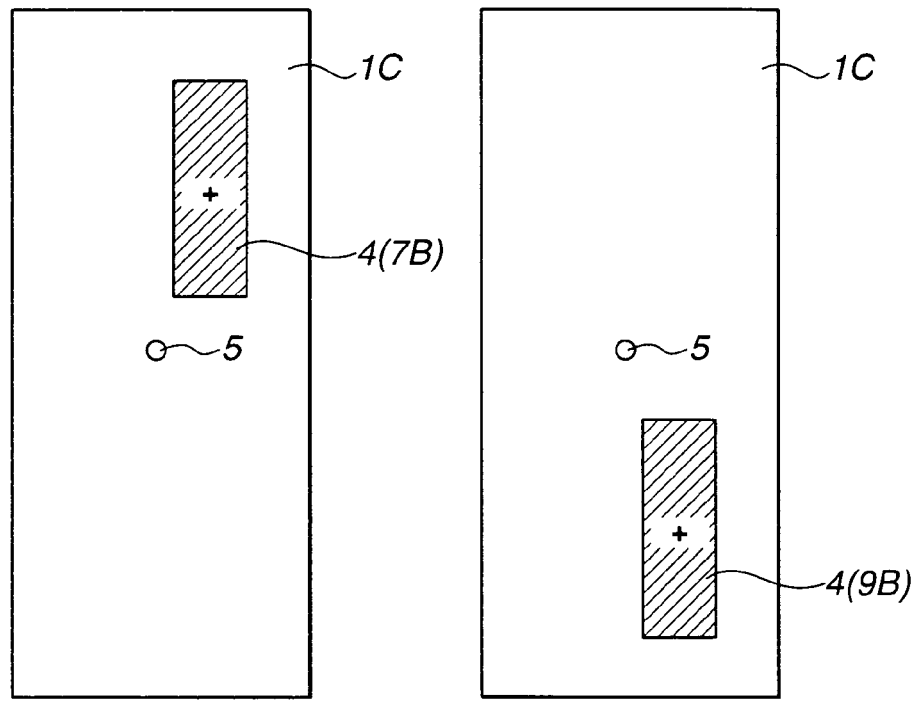
FIG.8A
FIG.8B  FIG.8C

ULTRASONIC TRANSDUCER AND ULTRASONIC MOTOR

This application claims benefit of Japanese Application No. 2003-068452 filed in Japan on Mar. 13, 2003, the contents of which are incorporated by this reference.

BACKGROUND OF THE INVENTION

1. Field of the Invention

The present invention relates to an ultrasonic transducer having a structure in which internal electrodes and piezoelectric elements are layered and an ultrasonic motor using the ultrasonic transducer.

2. Description of the Related Art

Ultrasonic motors have drawn attention in recent years as new motors which can be used in place of electromagnetic motors. The ultrasonic motors have the following advantages, compared with known electromagnetic motors.
(1) Low speed and high torque yielded without using gears
(2) High holding power
(3) Long stroke and high resolution
(4) Quiet
(5) No magnetic noise produced and no noise effects Ultrasonic motors having such advantages include rotary motors, linear motors, and two-dimensional motors. An ultrasonic transducer is disclosed in U.S. Pat. No. 5,345,137 B1, which was filed by the applicant, as a known technology pertaining to the two-dimensional ultrasonic motors.

A known two-dimensional ultrasonic motor disclosed in U.S. Pat. No. 5,345,137 B1 will be described below with reference to FIGS. 13 to 15.

FIGS. 13 to 15 are diagrams illustrating the structure example of the known two-dimensional ultrasonic motor. FIG. 13 is a perspective view showing the structure of an ultrasonic transducer used in the two-dimensional ultrasonic motor. FIG. 14 is an exploded perspective view of a first layered product used in the ultrasonic transducer in FIG. 13, viewed from above. FIG. 15 is an exploded perspective view of a second layered product used in the ultrasonic transducer in FIG. 13, viewed from above.

The structure of the ultrasonic transducer will now be described.

Note that in FIG. 13, numeral 101 denotes piezoelectric element, numeral 105a denotes outer electrode for ground, numerals 105b and 105c denote outer electrode, and numeral 107 denotes lead wire. Also, in FIG. 14 and FIG. 15, numeral 101 denotes piezoelectric element, numeral 107 denotes lead wire, numeral 108 denotes internal electrode, numeral 111 denotes first layered product, and numeral 112 denotes second layered product.

The known two-dimensional ultrasonic motor uses an ultrasonic transducer 100 shown in FIG. 13. The ultrasonic transducer 100 has a layered product 106 including a first layered product 106a and a second layered product 106b joined in series.

The first layered product 106a and the second layered product 106b each have a structure in which internal electrodes and piezoelectric elements are alternately layered.

Specifically, in the first layered product 106a, as shown in FIG. 14, a full electrode, a piezoelectric element, an internal electrode that is divided in half in a first direction, a piezoelectric element, a full electrode, a piezoelectric element, an internal electrode that is divided in half in a direction orthogonal to the first direction, a piezoelectric element, . . . are layered in this order.

In the second layered product 106b, as shown in FIG. 15, a full electrode, a piezoelectric element, a full electrode, a piezoelectric element, . . . are layered in this order.

The operation of the ultrasonic transducer will now be described.

Applying alternating voltage to the first layered product 106a in the ultrasonic transducer 100 having the structure described above excites flexural resonance in the XZ plane or flexural resonance in the YZ plane, the flexural resonance having a fixed end at the bottom of the ultrasonic transducer 100. Applying alternating voltage to the second layered product 106b in the ultrasonic transducer 100 excites vibration of the ultrasonic transducer 100 in the Z direction.

As shown in FIG. 13, a projection support 103 is provided on the top face of the ultrasonic transducer 100. Combining the vibration generates elliptical vibration having an arbitrary plane of vibration including the Z axis. Accordingly, pressing a driven body (not shown) toward a projection 104 on the projection support 103 moves the driven body in an arbitrary direction in the XY plane.

SUMMARY OF THE INVENTION

The present invention provides, an ultrasonic transducer, in which internal electrodes and piezoelectric elements are alternately layered, including outer electrodes. Each of the outer electrodes is connected to the corresponding internal electrodes. The ultrasonic transducer has a first layered part, a second layered part, a first outer-electrode group, and a second outer-electrode group. The first layered part includes at least the internal electrodes, each being divided in half in a second direction orthogonal to a layering direction, which is a first direction. The second layered part includes at least the internal electrodes, each being divided in half in a third direction orthogonal to the first direction and the second direction. The first outer-electrode group is provided so as to be connected to predetermined internal electrodes in the first layered part. The second outer-electrode group is provided so as to be connected to predetermined internal electrodes in the second layered part. Applying alternating voltage to the first outer-electrode group excites longitudinal resonance in the first direction and flexural resonance in the third direction and/or applying alternating voltage to the second outer-electrode group excites the longitudinal resonance in the first direction and flexural resonance in the second direction to generate ultrasonic elliptical vibration on the ultrasonic transducer.

These objects and advantages of the present invention will become further apparent from the following detailed explanation.

BRIEF DESCRIPTION OF THE DRAWINGS

FIG. 6A schematically illustrates the structure of an ultrasonic transducer according to a first modification of the first embodiment, and is a perspective view of the ultrasonic transducer, viewed obliquely from right above;

FIG. 6B is a left-side view of the ultrasonic transducer in FIG. 6A;

FIG. 6C is a rear-side view of the ultrasonic transducer in FIG. 6A;

FIG. 8A schematically illustrates the structure of an ultrasonic transducer according to a second modification of the first embodiment, and is a perspective view of the ultrasonic transducer, viewed obliquely from right above;

FIG. 8B is a left-side view of the ultrasonic transducer in FIG. 8A;

FIG. 8C is a rear-side view of the ultrasonic transducer in FIG. 8A;

DESCRIPTION OF THE PREFERRED EMBODIMENTS

Embodiments of the present invention will be described below with reference to the drawings.

First Embodiment

Structure

Figure 1A:
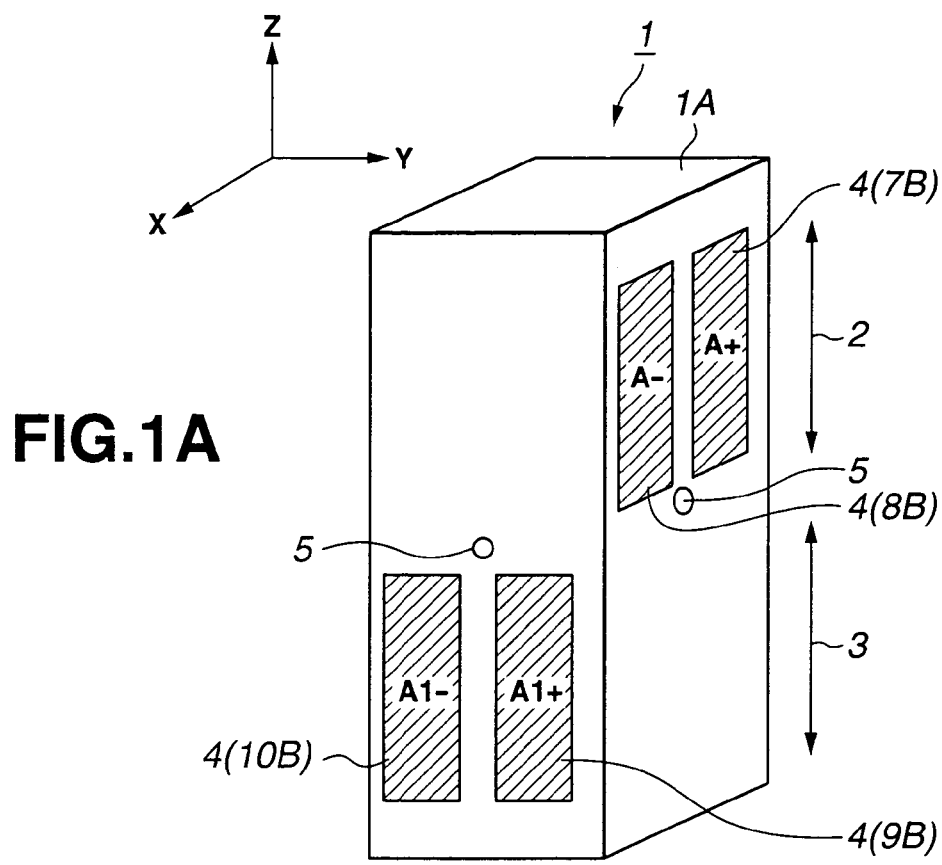
FIG. 1A schematically illustrates the structure of an ultrasonic transducer, according to a first embodiment of the present invention, mounted in an ultrasonic motor, and is a perspective view of the ultrasonic transducer, viewed obliquely from right above.
Figures 1B, 1C:
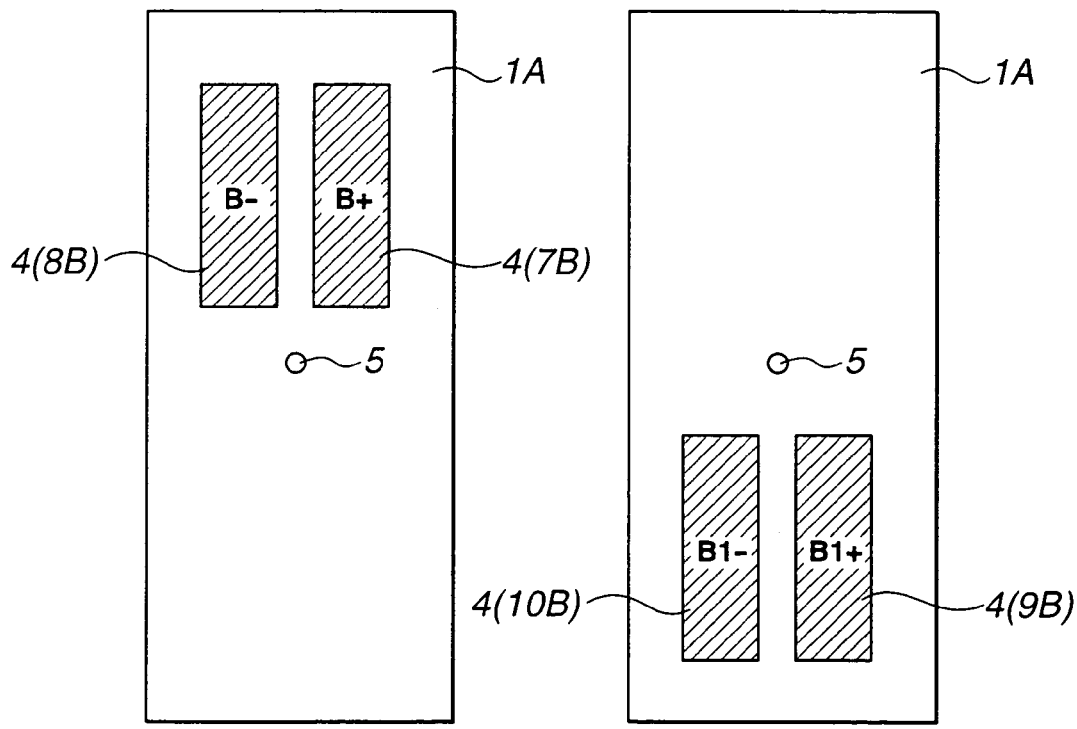
FIG. 1B is a left-side view of the ultrasonic transducer in FIG. 1A.
FIG. 1c is a rear-side view of the ultrasonic transducer in FIG. 1A.
Figure 2:
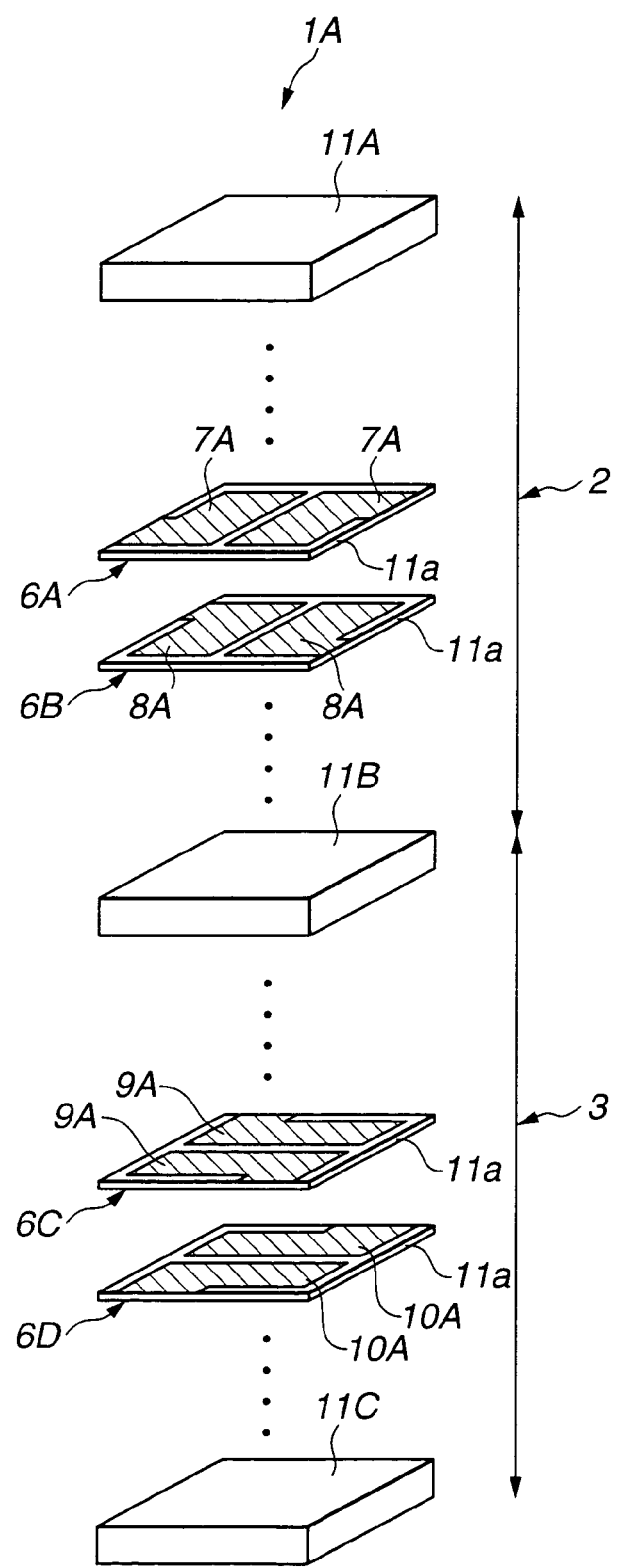
FIG. 2 is an exploded perspective view showing in detail the structure of internal electrodes of the ultrasonic transducer in FIG. 1A.
Figure 3A:
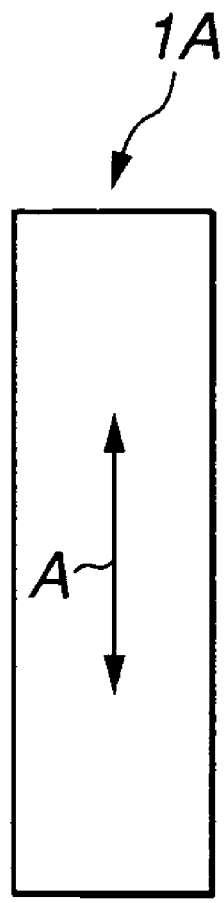
FIG. 3A illustrates a primary longitudinal resonant state of the ultrasonic transducer of the first embodiment.
Figure 3B:
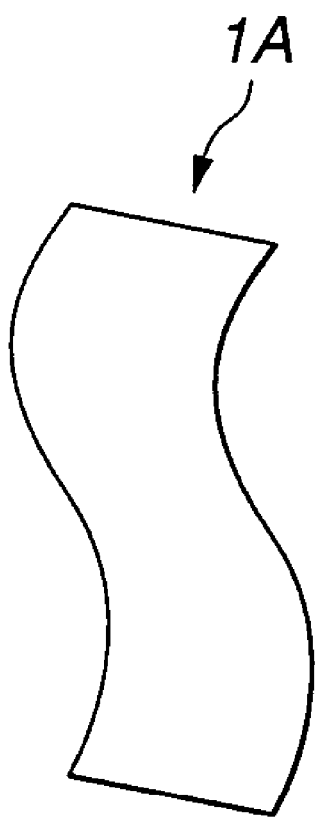
FIG. 3B illustrates a secondary flexural resonant state of the ultrasonic transducer of the first embodiment.
Figure 4:
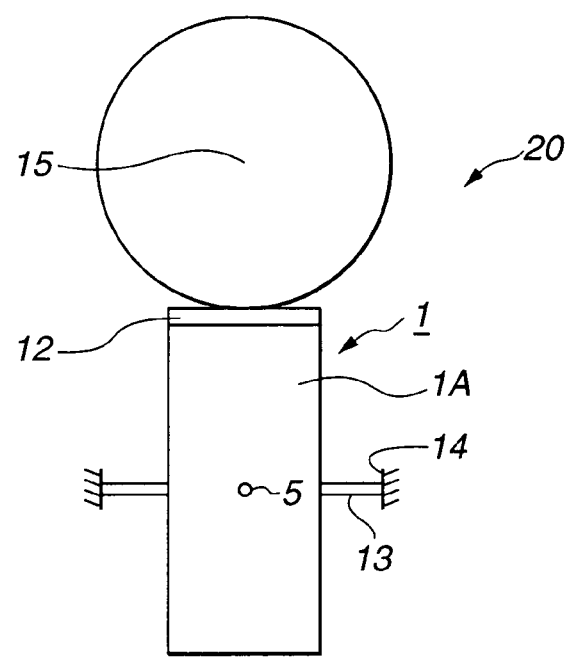
FIG. 4 is a conceptual diagram illustrating the basic structure of the ultrasonic motor using the ultrasonic transducer.
Figure 5:
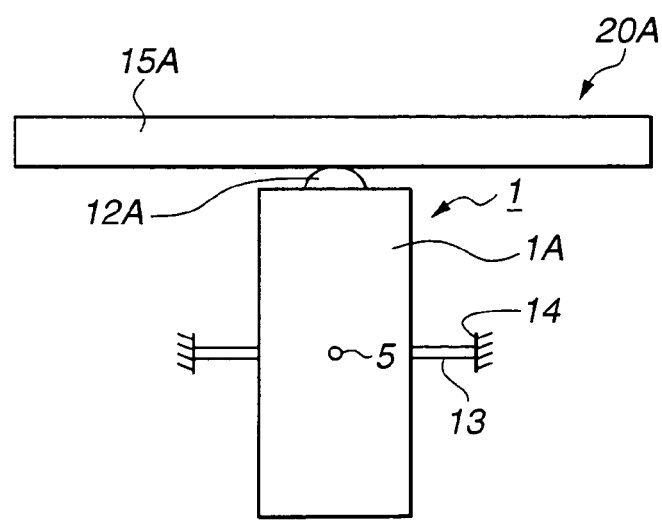
FIG. 5 is a conceptual diagram illustrating the basic structure of another ultrasonic motor.

An ultrasonic transducer according to a first embodiment of the present invention and ultrasonic motors using the ultrasonic transducer will now be described with reference to FIGS. 1A to 5. FIGS. 1A to 1C are diagrams schematically showing the structure of the ultrasonic transducer mounted in the ultrasonic motor. FIG. 1A is a perspective view of the ultrasonic transducer, viewed obliquely from right above. FIG. 1B is a left-side view of the ultrasonic transducer in FIG. 1A. FIG. 1C is a rear-side view of the ultrasonic transducer in FIG. 1A. FIG. 2 is an exploded perspective view showing in detail the structure of internal electrodes of the ultrasonic transducer in FIG. 1A. FIGS. 3A and 3B are perspective views showing the operating states of the ultrasonic transducer of the first embodiment; FIG. 3A illustrates a primary longitudinal resonant state and FIG. 3B illustrates a secondary flexural resonant state. FIG. 4 is a conceptual diagram illustrating the basic structure of the ultrasonic motor using the ultrasonic transducer 1. FIG. 5 is a conceptual diagram illustrating the basic structure of another ultrasonic motor.

The structure of the ultrasonic transducer, according to the first embodiment, mounted in the ultrasonic motor will now be described in detail with reference to FIGS. 1A to 1c.

The ultrasonic transducer 1 of the first embodiment is a layered ultrasonic transducer, as shown in FIG. 1A, and mainly includes a prismatic layered product 1A having a substantially square cross section.

The layered product 1A includes a first layered part 2 which is a substantially upper-half layered product, a second layered part 3 which is a substantially lower-half layered product, and outer electrodes 4 (7B, 8B, 9B, and 10B) provided at predetermined positions on the first layered part 2 or the second layered part 3.

Silver-plated A-phase outer electrodes (A+ and A−) 7B and 8B, which constitute the outer electrodes 4 on the first layered part 2, are formed at the upper part on the right face of the layered product 1A. Silver-plated A1-phase outer electrodes (A1+ and A1−) 9B and 10B, which constitute the outer electrodes 4 on second layered part, are formed at the lower part on the front face of the layered product 1A.

Holes 5 in which, for example, pins 13 (refer to FIG. 4) for holding the ultrasonic transducer 1 are mounted are provided at the substantially longitudinal and lateral centers of the side faces on the layered product 1A.

In the ultrasonic transducer 1 of the first embodiment, silver-plated B-phase outer electrodes (B+ and B−) 7B and 8B, which constitute an outer electrodes on the first layered part 2, are formed at the upper part on the left face of the layered product 1A, as shown in FIG. 1B.

Silver-plated B1-phase outer electrodes (B1+ and B1−) 9B and 10B, which constitute an outer electrodes 4 on a second layered part 3, are formed at the lower part on the back face (rear face) of the layered product 1A, as shown in FIG. 1C.

In other words, plating the surfaces of internal electrodes (the outer electrodes 7B, 8B, 9B, and 10B), which are exposed on the respective side faces of the layered product 1A, with silver forms at least four kinds of outer electrodes; that is, the A-phase outer electrodes (A+ and A−), the A1-phase outer electrodes (A1+ and A1−), the B-phase outer electrodes (B+ and B−), and the B1-phase outer electrodes (B1+ and B1−), which are necessary for two-dimensionally exciting the ultrasonic transducer 1.

According to the first embodiment, the layered product 1A measures, for example, 5 mm wide by 5 mm long by 19 mm high.

The structure of the internal electrodes of the ultrasonic transducer 1, which is a characteristic of the first embodiment, will now be described in detail with reference to FIG. 2.

As shown in FIG. 2, in the layered product 1A of the ultrasonic transducer 1 is constructed of three first piezoelectric sheets 11A to 1C, which serve as insulators and do not undergo electrode treatment; and of a plurality of rectangular second piezoelectric sheets 6A and 6B, which are sandwiched between the first piezoelectric sheet 11A and the first piezoelectric sheet 11B and undergo electrode treatment, and a plurality of rectangular second piezoelectric sheets 6C and 6D, which are sandwiched between the first piezoelectric sheet 11B and the first piezoelectric sheet 11C and undergo electrode treatment, constituting respectively the first layered part 2 and the second layered part 3.

Specifically, alternately layering the two kinds of second piezoelectric sheets 6A and 6B so as to be sandwiched between the first piezoelectric sheet 11A at the top of the layered product 1A and the first piezoelectric sheet 11B at the center of the layered product 1A constitutes the first layered part 2. Alternately layering the two kinds of second piezoelectric sheets 6C and 6D so as to be sandwiched between the first piezoelectric sheet 11B at the center of the layered product 1A and the first piezoelectric sheet 11C at the bottom of the layered product 1A constitutes the second layered part 3.

The first layered part 2 has a structure in which the second piezoelectric sheets 6A, each having a first internal electrode 7A formed thereon, and the second piezoelectric sheets 6B, each having a second internal electrode 8A formed thereon, are alternately layered.

The second layered part 3 has a structure in which the second piezoelectric sheets 6C, each having a third internal electrode 9A formed thereon, and the second piezoelectric sheets 6D, each having a fourth internal electrode 10A formed thereon, are alternately layered.

In the first layered part 2, the second piezoelectric sheet 6A is formed such that the first internal electrode 7A is substantially divided in half on a piezoelectric sheet part 11a and so as to have areas to be connected to the outer electrodes (for the A-phase outer electrode (A+) and for the B-phase outer electrode (B+)) at the corresponding edges.

The second piezoelectric sheet 6B is formed such that the second internal electrode 8A is substantially divided in half on a piezoelectric sheet part 11a and so as to have areas to be connected to the outer electrodes (for the A-phase outer electrode (A−) and for the B-phase outer electrode (B−)) at the corresponding edges.

In the second layered part 3, the second piezoelectric sheet 6C is formed such that the third internal electrode 9A is substantially divided in half on a piezoelectric sheet part 11a and so as to have areas to be connected to the outer electrodes (for the A1-phase outer electrode (A1+) and for the B1-phase outer electrode (B1+)) at the corresponding edges.

The second piezoelectric sheet 6D is formed such that the fourth internal electrode 10A is substantially divided in half on a piezoelectric sheet part 11a and so as to have areas to be connected to the outer electrodes (for the A1-phase outer electrode (A1−) and for the B1-phase outer electrode (B1−)) at the corresponding edges.

Further specifically, according to the first embodiment, alternately layering the second piezoelectric sheets 6A and 6B, each having a thickness of about 80 µm, constitutes the first layered part 2. The internal electrode that is made of silver or alloy of silver and palladium and that has a thickness of several micrometers is subject to patterning by printing on each of the second piezoelectric sheets 6A and 6B.

The first internal electrode 7A is substantially divided in half with a clearance of around 500 µm being left in the X direction (refer to FIG. 1A) on the second piezoelectric sheet 6A. The second internal electrode 8A is substantially divided in half with a clearance of around 500 µm being left in the X direction (refer to FIG. 1) on the second piezoelectric sheet 6B.

The right pane of the first internal electrode 7A is formed along the edge only at a portion that is in contact with the A-phase outer electrode (A+) for conductivity, and has a clearance with a width of around 500 µm from the corresponding edges at the remaining portions. The left pane of the first internal electrode 7A is formed along the edge only at a portion that is in contact with the B-phase outer electrode (B+) for conductivity, and has a clearance with a width of around 500 µm from the corresponding edges at the remaining portions.

The right pane of the second internal electrode 8A is formed along the edge only at a portion that is in contact with the A-phase outer electrode (A−) for conductivity, and has a clearance with a width of around 500 µm from the corresponding edges at the remaining portions. The left pane of the second internal electrode 8A is formed along the edge only at a portion that is in contact with the B-phase outer electrode (B−) for conductivity, and has a clearance with a width of around 500 µm from the corresponding edges at the remaining portions.

The third internal electrode 9A is substantially divided in half with a clearance of around 500 µm being left in the Y direction (refer to FIG. 1) on the second piezoelectric sheet 6C. The fourth internal electrode 10A is substantially divided in half with a clearance of around 500 µm being left in the Y direction on the second piezoelectric sheet 6D.

The front pane of the third internal electrode 9A is formed along the edge only at a portion that is in contact with the A1-phase outer electrode (A1+) for conductivity, and has a clearance with a width of around 500 µm from the corresponding edges at the remaining portions. The back pane of the third internal electrode 9A is formed along the edge only at a portion that is in contact with the B1-phase outer electrode (B1+) for conductivity, and has a clearance with a width of around 500 µm from the corresponding edges at the remaining portions.

The front pane of the fourth internal electrode 10A is formed along the edge only at a portion that is in contact with the A1-phase outer electrode (A1−) for conductivity, and has a clearance with a width of around 500 µm from the corresponding edges at the remaining portions. The back pane of the fourth internal electrode 10A is formed along the edge only at a portion that is in contact with the B1−phase outer electrode (B1−) for conductivity, and has a clearance with a width of around 500 µm from the corresponding edges at the remaining portions.

The ultrasonic transducer 1 having the structure of the internal electrodes, which is a characteristic of the first embodiment, is structured in the manner described above.

Next, the manufacturing process of the ultrasonic transducer 1 according to the first embodiment will now be described.

According to the first embodiment, the first piezoelectric sheets 11A to 11C and the second piezoelectric sheets 6A to 6D are formed of PZT material having a high piezoelectric constant.

First, PZT calcined powder is mixed with a solvent to manufacture the two kinds of piezoelectric sheets (also referred to as green sheets) (the first piezoelectric sheets 11A to 11C and the piezoelectric sheet parts 11a of the second piezoelectric sheets 6A to 6D) by using a doctor blade method.

The second piezoelectric sheets 11A to 11C are formed so as to be thicker than the second piezoelectric sheets 6A to 6D (the piezoelectric sheet parts 11a: refer to FIG. 2). Conversely, the second piezoelectric sheets 6A to 6D (the piezoelectric sheet parts 11a) are formed so as to be thinner than the first piezoelectric sheets 11A to 1C.

A plurality of piezoelectric sheet parts 11a is provided. The four kinds of internal-electrode patterns (refer to FIG. 2) are formed by printing to manufacture the second piezoelectric sheets 6A to 6D shown in FIG. 2. Next, the first piezoelectric sheets 11A to 11C are provided. The four kinds of second piezoelectric sheets 6A to 6D are accurately positioned for layering between the first piezoelectric sheets 11A to 11C in the layered structure shown in FIG. 2.

Then, the layered product 1A that has been layered is pressed by using a hot press machine and is dewaxed and fired in an electric furnace.

The layered product 1A is plated with silver at predetermined positions (refer to FIGS. 1A to 1C) to form the outer electrodes 4 and polarization is performed by using a polarizing apparatus. The polarities in the polarization are shown by + and − in FIGS. 1A to 1C.

The holes 5 having a diameter of around 0.5 mm are formed at the substantial centers of the four side faces of the layered product 1A.

Finally, a lead wire or a flexible substrate is connected to each of the outer electrodes 4 to provide a lead terminal, although not shown.

The ultrasonic transducer 1 of the first embodiment (layered product 1A) is manufactured in the manner described above.

Although one ultrasonic transducer 1 is manufactured in the first embodiment as an example, simultaneously printing the same internal-electrode patterns on a large piezoelectric sheet and cutting out each of the internal-electrode patterns before firing in the electric furnace can simultaneously manufacture a plurality of ultrasonic transducers 1, thus simplifying the manufacturing process and reducing the manufacturing cost. As a modification, the first layered part 2 may be produced separately from the second layered part 3 to manufacture the layered product 1A by bonding the first layered part 2 with the second layered part 3.

Operation

The operation of the ultrasonic transducer 1 having the structure described above will now be described in detail with reference to FIGS. 1A to 3B.

It is assumed that the lead wire (or the flexible substrate) is connected by soldering to the lead terminal of each of the outer electrodes 4, although not shown, and that the lead wire (or the flexible substrate) is electrically connected to a four-phase driving power supply that acts as driving power-supply means for the ultrasonic transducer 1, although not shown.

Applying alternating voltage having a frequency of 70 KHz in phase to the A-phase outer electrodes and the B-phase outer electrodes of the ultrasonic transducer 1 in FIG. 1A excites primary longitudinal resonance in the ultrasonic transducer 1. A direction A shown in FIG. 3A corresponds to the Z direction (refer to FIG. 1A) in this primary longitudinal resonance.

Applying alternating voltage having a frequency of 70 KHz out of phase by 180 degrees to the A-phase outer electrodes and the B-phase outer electrodes excites secondary flexural resonance in the ultrasonic transducer 1. The plane of vibration shown in FIG. 3B is in the YZ plane in FIG. 1A in this secondary flexural resonance.

Applying alternating voltage having a frequency of 70 KHz out of phase by 90 degrees to the A-phase outer electrodes and the B-phase outer electrodes simultaneously excites the longitudinal resonance (refer to FIG. 3A) and the flexural resonance (refer to FIG. 3B) to generate ultrasonic elliptical vibration on the top face of the ultrasonic transducer 1. The plane of the elliptical vibration is in the YZ plane in FIG. 1A.

Then, applying alternating voltage having a frequency of 70 KHz in phase to the A1-phase outer electrodes and the B1-phase outer electrodes of the ultrasonic transducer 1 in FIG. 1A excites the primary longitudinal resonance in the ultrasonic transducer 1. The direction A shown in FIG. 3A corresponds to the Z direction (refer to FIG. 1A) in this primary longitudinal resonance.

Applying alternating voltage having a frequency of 70 KHz out of phase by 180 degrees to the A1-phase outer electrodes and the B1-phase outer electrodes excites the secondary flexural resonance in the ultrasonic transducer 1. The plane of vibration shown in FIG. 3B is in the XZ plane in FIG. 1A in this secondary flexural resonance.

Applying alternating voltage having a frequency of 70 kHz out of phase by 90 degrees to the A1-phase outer electrodes and the B1-phase outer electrodes simultaneously excites the longitudinal resonance (refer to FIG. 3A) and the flexural resonance (refer to FIG. 3B) to generate the ultrasonic elliptical vibration on the top face of the ultrasonic transducer 1. The plane of the elliptical vibration is in the XZ plane in FIG. 1A.

Finally, applying alternating voltage having a frequency of 70 KHz to the A-phase, B-phase, A1-phase, and B1-phase outer electrodes of the ultrasonic transducer 1 of the first embodiment excites the ultrasonic elliptical vibration in an arbitrary plane including the Z axis on the top face of the ultrasonic transducer 1. In this application of the alternating voltage, the A-phase outer electrodes differ in phase from the B-phase outer electrodes by 90 degrees or −90 degrees and the A1-phase outer electrodes differ in phase from the B1-phase outer electrodes by 90 degrees or −90 degrees to vary the applied voltage.

The structure of the two-dimensional ultrasonic motor 20 using the ultrasonic transducer 1 will now be described in detail with reference to FIG. 4.

The ultrasonic motor 20 of the first embodiment has the ultrasonic transducer 1 having the above structure, a frictional member 12 provided on the top face of the ultrasonic transducer 1, a spherical driven body 15 that is supported by using pressing means (not shown) so as to be in contact with the frictional member 12, and the pins 13 mounted in the holes 5 of the ultrasonic transducer 1, as shown in FIG. 4.

The frictional member 12 is provided on the top face of the ultrasonic transducer 1 where the ultrasonic elliptical vibration is excited. Specifically, a grindstone including alumina abrasive grains, which acts as the frictional member, is bonded to the ultrasonic transducer 1.

The holes 5, in which the pins 13 are mounted, are provided at the substantial centers of the respective four side faces of the ultrasonic transducer 1, as shown in FIG. 1A. The pins 13 inserted in the four directions are fixed on walls 14 in the casing of the ultrasonic motor 20 to hold and fix the ultrasonic transducer 1 in the casing of the ultrasonic motor 20.

According to the first embodiment, the holes 5 in which the pins 13 are mounted are provided at the substantial nodes of the longitudinal resonance and the flexural resonance generated by the ultrasonic transducer 1 (at the substantial centers of the side faces of the layered product 1A).

The driven body 15, which is formed of, for example, zirconia ceramics, is rotatably pressed toward the ultrasonic transducer 1 vertically or vertically and laterally by using the pressing means (not shown), as described above.

Next, the operation of the ultrasonic motor 20 having the structure described above will now be described.

It is assumed, in the ultrasonic motor 20, that alternating voltage having a frequency of 70 KHz is applied to the A-phase, B-phase, A1-phase, and B1-phase outer electrodes of the ultrasonic transducer 1 and that the A-phase outer electrodes differ in phase from the B-phase outer electrodes by 90 degrees or −90 degrees and the A1-phase outer electrodes differ in phase from the B1-phase outer electrodes by 90 degrees or −90 degrees to vary the applied voltage.

This application of the alternating voltage excites the ultrasonic elliptical vibration in an arbitrary plane including the Z axis on the top face of the ultrasonic transducer 1. The spherical driven body 15 is interlocked with this vibration to be driven in an arbitrary direction of rotation having the rotation axis in the XY plane.

The ultrasonic motor 20 of the present invention is not limited to the structure shown in FIG. 4 and may have a structure, for example, shown in FIG. 5. Specifically, as shown in FIG. 5, a spherical frictional member 12A may be substituted for the flat frictional member 12 in FIG. 4 and a driven plate 15A may be substituted for the spherical driven body 15 in FIG. 4. Even in the ultrasonic motor 20A having such a structure, applying voltage to the ultrasonic transducer 1 can drive the driven plate 15A in an arbitrary direction in the XY plane, as in the above case.

Advantages

According to the first embodiment, structuring the ultrasonic transducer 1 in the four-phase driving method allows the impedance of each phase to be equal, thus achieving simplification of the driving power-supply circuit and reduction in size of the driving power-supply circuit.

In known ultrasonic motors, an ultrasonic transducer mounted in each of the ultrasonic motors is fixed at its bottom face and the natural frequency of the ultrasonic transducer itself is drastically varied depending on the structure (size, mass, rigidity, and so on) of a fixing member for fixing the bottom face of the ultrasonic transducer. In contrast, in the ultrasonic motor 20 or 20A of the first embodiment, since the ultrasonic transducer 1 is held at the node common to the longitudinal resonance and the flexural resonance, the variation in the natural frequency of the ultrasonic transducer 1 is considerably small.

Modifications of the first embodiment will now be described in detail with reference to FIGS. 6A to 10D.

First Modification

Figure 7:
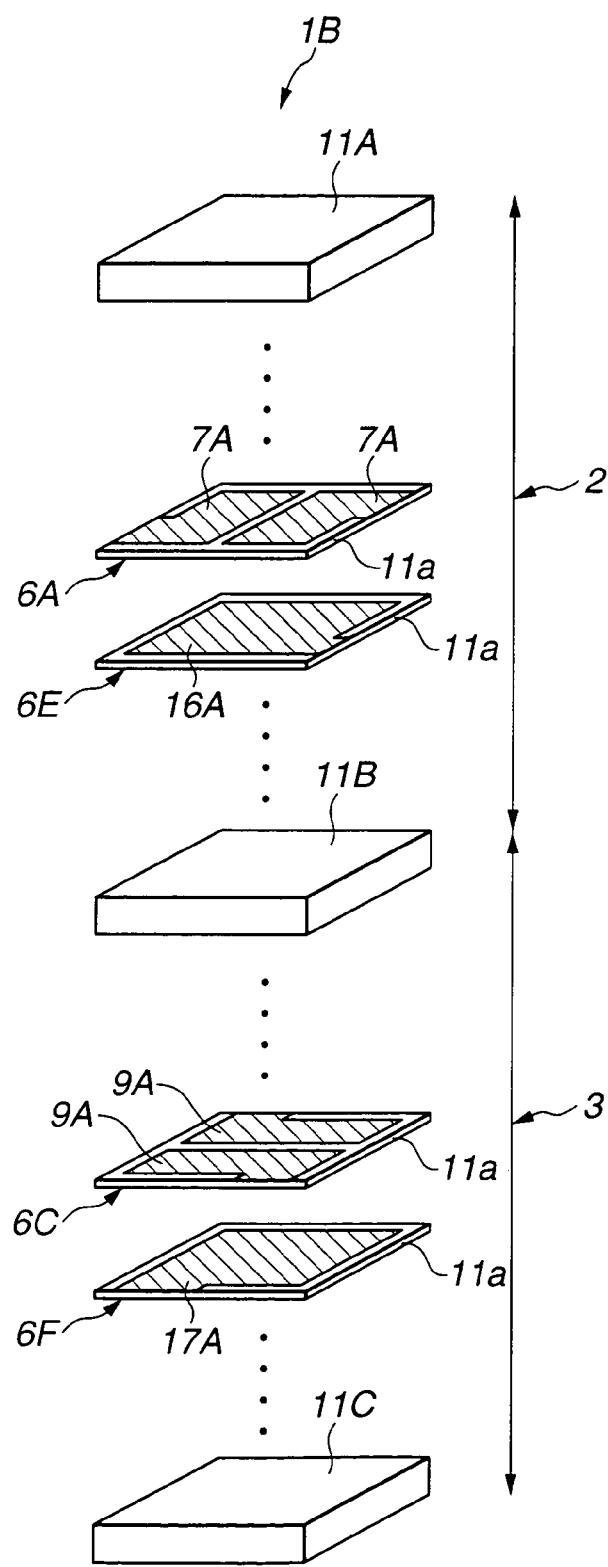
FIG. 7 is an exploded perspective view showing in detail the structure of internal electrodes of the ultrasonic transducer in FIG. 6A.

FIGS. 6A to 6C are diagrams schematically showing the structure of the ultrasonic transducer according to a first modification of the first embodiment. FIG. 6A is a perspective view of the ultrasonic transducer, viewed obliquely from right above. FIG. 6B is a left-side view of the ultrasonic transducer in FIG. 6A. FIG. 6C is a rear-side view of the ultrasonic transducer in FIG. 6A. FIG. 7 is an exploded perspective view showing in detail the structure of internal electrodes of the ultrasonic transducer in FIG. 6A. The same reference numerals are used in FIGS. 6A to 6C to identify the same components as in the ultrasonic transducer of the first embodiment. The description of such components is omitted here and only the components different from those in the ultrasonic transducer of the first embodiment will be described.

According to the first modification, the second piezoelectric sheet 6A on which the first internal electrode 7A is divided in half and the second piezoelectric sheet 6C on which the third internal electrode 9A is divided in half are used in the same manner as in the first embodiment. A layered product 1B is characterized by using a second piezoelectric sheet 6E on which a second internal electrode 16A is not divided in half and a second piezoelectric sheet 6F on which a fourth internal electrode 17A is not divided in half.

Referring to FIG. 7, the second internal electrode 16A is formed on the substantially overall surface of the second piezoelectric sheet 6E with a clearance along the edges of the piezoelectric sheet part 11a, and part of the second internal electrode 16A is formed along one of the edges.

The fourth internal electrode 17A is formed on the substantially overall surface of the second piezoelectric sheet 6F with a clearance along the edges of the piezoelectric sheet part 11a, and part of the fourth internal electrode 17A is formed along one of the edges.

Hence, as in the first embodiment, the first layered part 2 has a structure in which the second piezoelectric sheets 6A, each having the first internal electrode 7A formed thereon, and the second piezoelectric sheets 6E, each having the second internal electrode 16A formed thereon, are alternately layered. The second layered part 3 has a structure in which the second piezoelectric sheets 6C, each having the third internal electrode 9A formed thereon, and the second piezoelectric sheets 6F, each having the fourth internal electrode 17A formed thereon, are alternately layered. The layered product 1B of the first modification is formed in the manner described above (refer to FIG. 6A).

As shown in FIGS. 6A to 6C, forming the outer electrodes 4 at the positions where the outer electrodes provided at the respective edges of the internal electrodes are arranged can reduce the number of the outer electrodes from eight in the first embodiment to six in the first modification. In other words, as shown in FIGS. 6A to 6C, an outer electrode 16B acts as the minus sides of A-phase and B-phase outer electrodes and an outer electrode 17B acts as the minus sides of A1-phase and B1-phase outer electrodes.

Other structures and effects are the same as in the ultrasonic transducer of the first embodiment.

In addition to the same effects as in the first embodiment, the first modification is more effective than the first embodiment for achieving reduction in the manufacturing cost and simplification of the manufacturing process.

Second Modification

Figure 9:
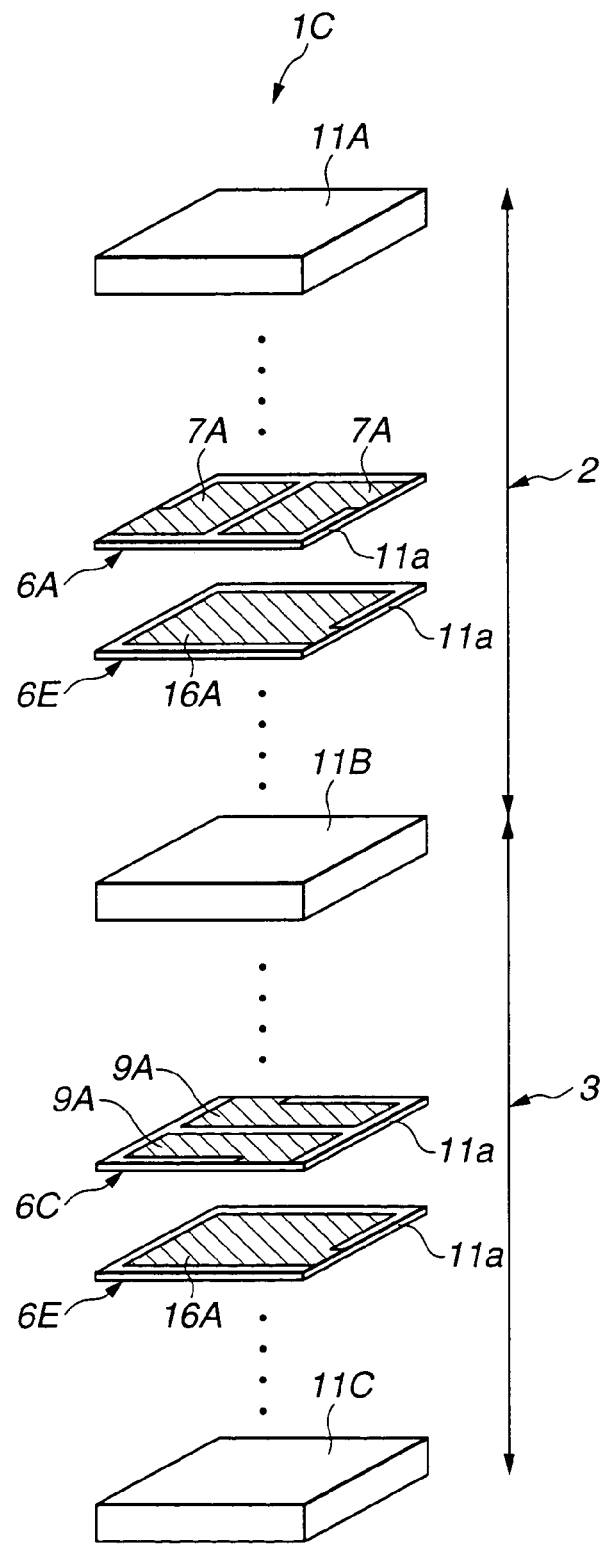
FIG. 9 is an exploded perspective view showing in detail the structure of internal electrodes of the ultrasonic transducer in FIG. 8A.

FIGS. 8A to 8C are diagrams schematically showing the structure of the ultrasonic transducer according to a second modification of the first embodiment. FIG. 8A is a perspective view of the ultrasonic transducer, viewed obliquely from right above. FIG. 8B is a left-side view of the ultrasonic transducer. FIG. 8C is a rear-side view of the ultrasonic transducer. FIG. 9 is an exploded perspective view showing in detail the structure of internal electrodes of the ultrasonic transducer in FIG. 8A. The same reference numerals are used in FIGS. 8A to 8C to identify the same components as in the ultrasonic transducer of the first embodiment. The description of such components is omitted here and only the components different from those in the ultrasonic transducer of the first embodiment will be described.

The second modification is an improvement of the first modification and characterized in that a piezoelectric sheet having the same shape as the second piezoelectric sheet 6E in the first layered part 2 is used as the second piezoelectric sheet having the fourth internal electrode in the second layered part 3 so that the outer electrode of the second internal electrode is joined with the outer electrode of the fourth internal electrode on a common plane.

Referring to FIG. 9, the second layered part 3 has a structure in which the second piezoelectric sheets 6C, each having the third internal electrode 9A formed thereon, and the second piezoelectric sheets 6E, each having the fourth internal electrode 16A formed thereon, are alternately layered such that the fourth internal electrodes 16A that are in contact with the outer electrodes at the edges of the second piezoelectric sheets 6E in the second layered part 3 face the same direction as the outer electrodes of the second piezoelectric sheets 6E in the first layered part 2. A layered product 1C of the second modification is formed in the manner described above (refer to FIG. 8A).

As shown in FIGS. 8A to 8C, the number of the outer electrodes can be further decreased by one to five, compared with the first modification.

Other structures and effects are the same as in the ultrasonic transducer of the first embodiment.

According to the second modification, the number of the outer electrodes can be further reduced by one. Since it is enough to provide the two kinds of second piezoelectric sheets (the second piezoelectric sheets 6A and 6C, and the second piezoelectric sheet 6E), the second modification is more effective than the first modification for achieving reduction in the manufacturing cost and simplification of the manufacturing process.

Third Modification

Figure 10A:
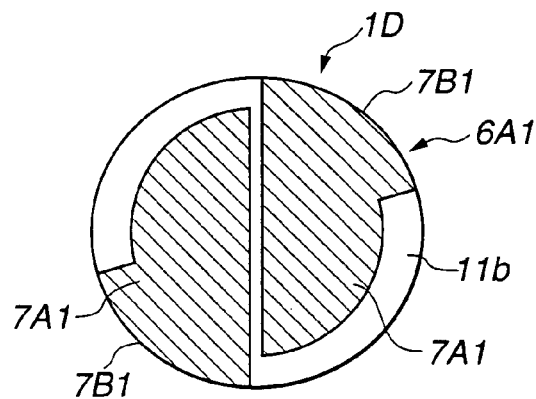
FIG. 10A illustrates the structure of internal electrodes on second piezoelectric sheets in an ultrasonic transducer according to a third modification of the first embodiment, and is a top view of the second piezoelectric sheet having a first internal electrode.
Figure 10B:
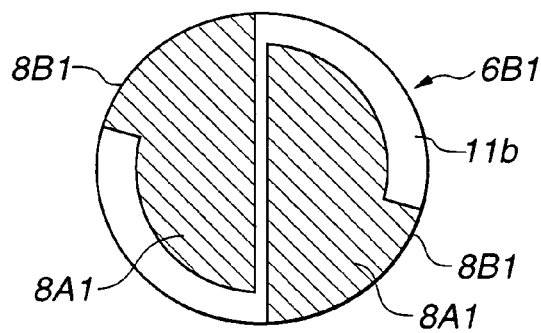
FIG. 10B is a top view of the second piezoelectric sheet having a second internal electrode.
Figure 10C:
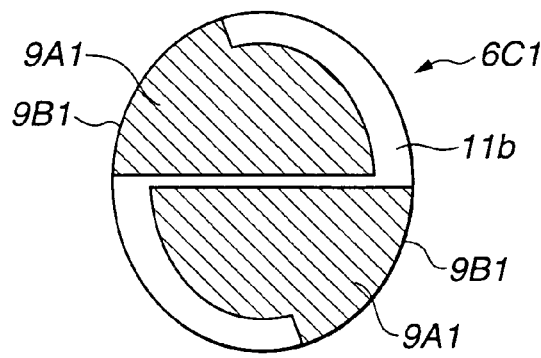
FIG. 10C is a top view of the second piezoelectric sheet having a third internal electrode.
Figure 10D:
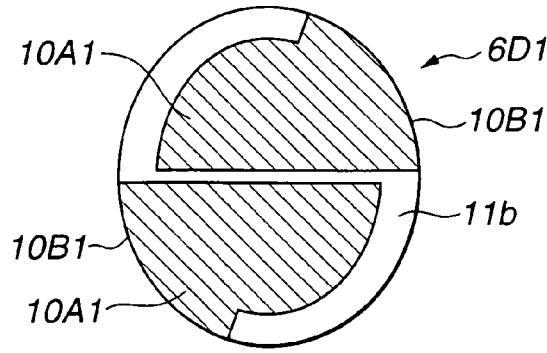
FIG. 10D is a top view of the second piezoelectric sheet having a fourth inter electrode.

FIGS. 10A to 10D are diagrams showing a third modification of the first embodiment and illustrating the structure of internal electrodes on the second piezoelectric sheets in the ultrasonic transducer. FIG. 10A is a top view of the second piezoelectric sheet having a first internal electrode. FIG. 10B is a top view of the second piezoelectric sheet having a second internal electrode. FIG. 10C is a top view of the second piezoelectric sheet having a third internal electrode. FIG. 10D is a top view of the second piezoelectric sheet having a fourth inter electrode. The same reference numerals are used in FIGS. 10A to 10D to identify the same components as in the ultrasonic transducer of the first embodiment. The description of such components is omitted here and only the components different from those in the ultrasonic transducer of the first embodiment will be described.

Although the prismatic ultrasonic transducer is formed in the first embodiment, the third modification is characterized in that the ultrasonic transducer is formed in a columnar shape instead of the prismatic shape. The shapes of the internal electrodes on the respective second piezoelectric sheets are shown in FIGS. 10A to 10D.

That is, the second piezoelectric sheet 6A in the ultrasonic transducer of the first embodiment (refer to FIG. 2) corresponds to a second piezoelectric sheet 6A1 in FIG. 10A, the second piezoelectric sheet 6B corresponds to a second piezoelectric sheet 6B1 in FIG. 10B, the second piezoelectric sheet 6C corresponds to a second piezoelectric sheet 6C1 in FIG. 10C, and the second piezoelectric sheet 6D corresponds to a second piezoelectric sheet 6D1 in FIG. 10D.

Accordingly, a first internal electrode 7A1 on the second piezoelectric sheet 6A1 is divided in half, and outer electrodes 7B1 are formed along parts of the edge of the first internal electrode 7A1, as in the first embodiment, although the shape of the first internal electrode 7A1 is different from that of the first internal electrode 7A. The same applies to the second piezoelectric sheets 6B1, 6C1, and 6D1.

According to the third modification, layering the columnar first piezoelectric sheets and the second piezoelectric sheets constitutes a columnar ultrasonic transducer (layered product 1D), although not shown.

Although the layered product 1D has the R-shaped circumference in accordance with the columnar ultrasonic transducer, the outer electrodes are arranged in the same manner as in the first embodiment. Accordingly, the description of the arrangement is omitted here.

Other structures, effects, and advantages are the same as in the ultrasonic transducer of the first embodiment.

Further, the ultrasonic motor shown in FIG. 4 or the ultrasonic motor in FIG. 5 may have the ultrasonic transducer of any of the above modifications in the first embodiment. The same effects and advantages as in the first embodiment can be achieved also in such a case.

Second Embodiment

Structure

Figure 11:
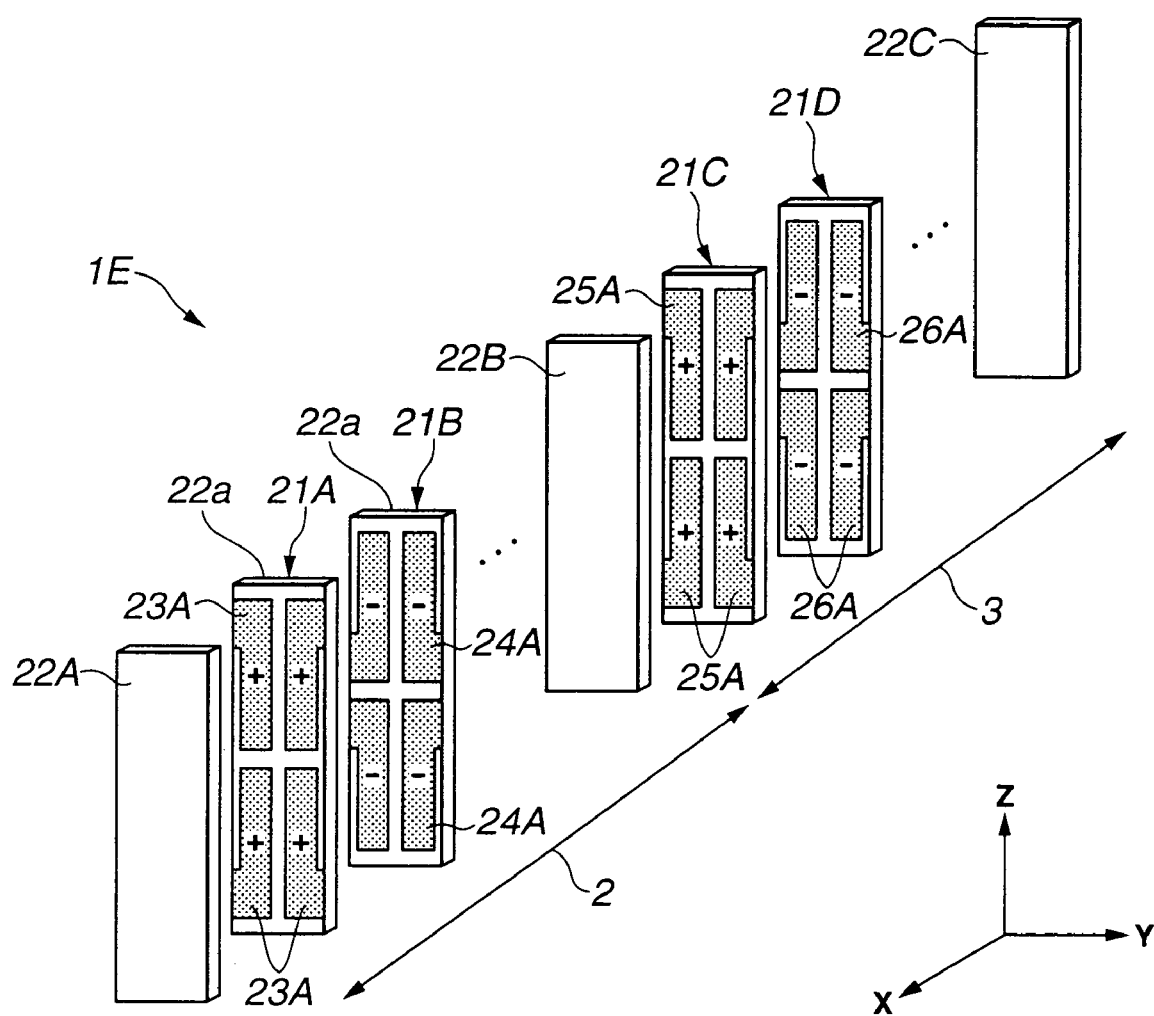
FIG. 11 is an exploded perspective view showing in detail the structure of internal electrodes in an ultrasonic transducer according to a second embodiment of the present invention.
Figure 12:
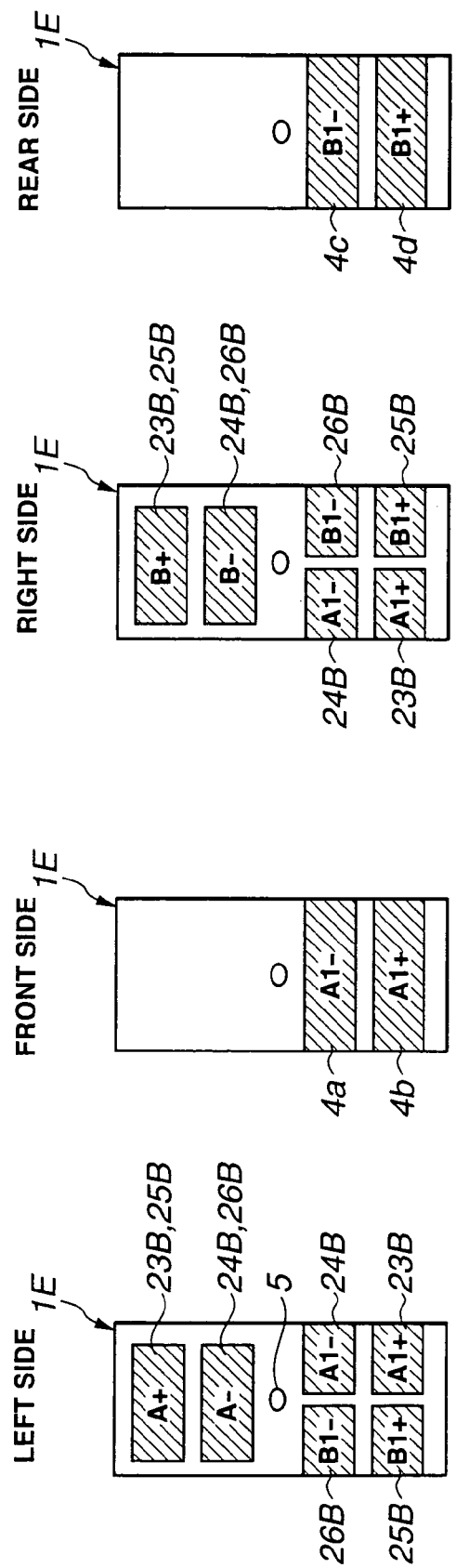
FIG. 12A schematically illustrates the structure of the ultrasonic transducer of the second embodiment, and is a left-side view of the ultrasonic transducer.
FIG. 12B is a front view of the ultrasonic transducer of the second embodiment.
FIG. 12C is a right-side view of the ultrasonic transducer of the second embodiment.
FIG. 12D is a rear (back) view of the ultrasonic transducer of the second embodiment.
Figure 13:
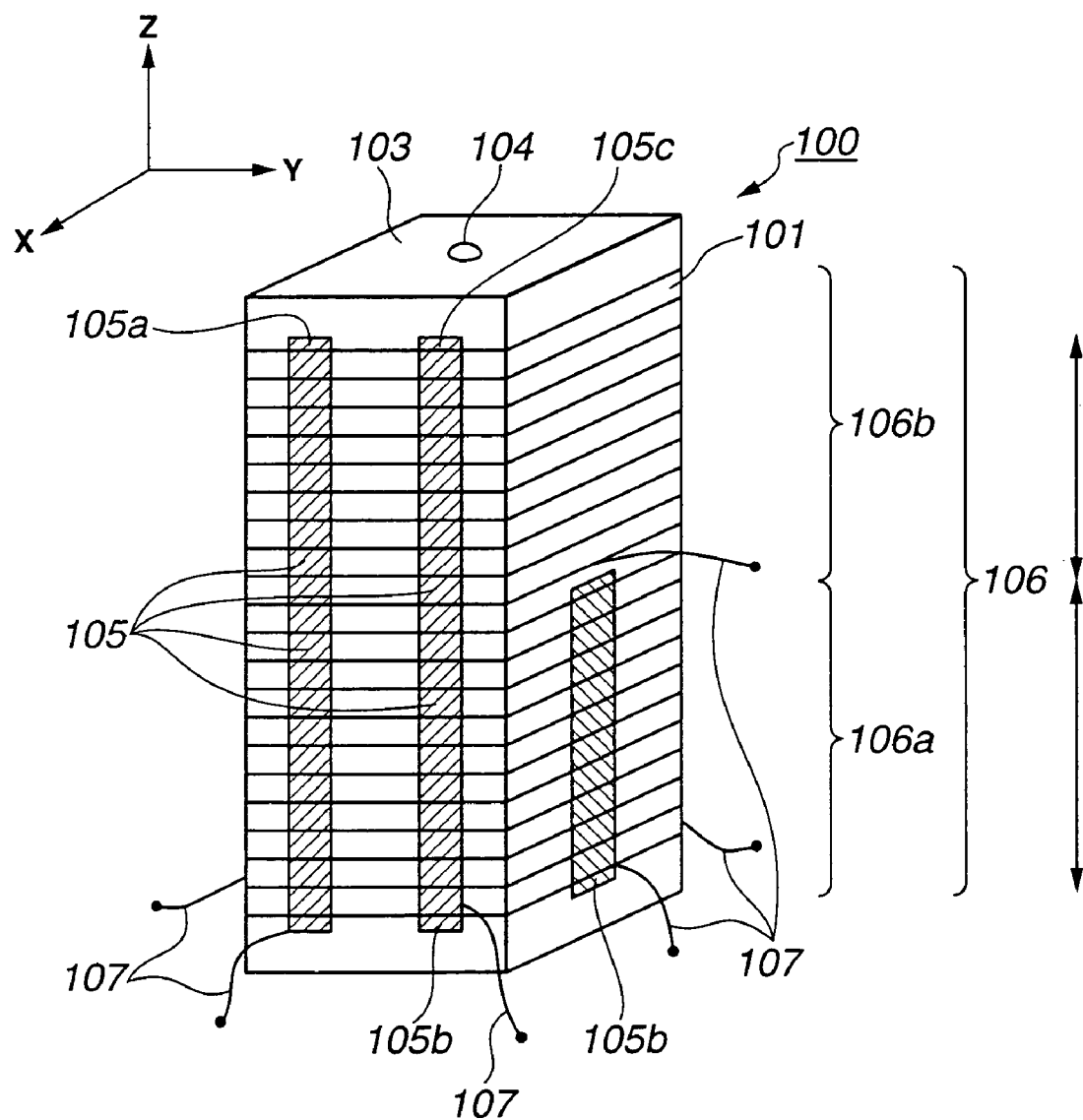
FIG. 13 is a perspective view showing the structure of an ultrasonic transducer used in a known two-dimensional ultrasonic motor.
Figure 14:
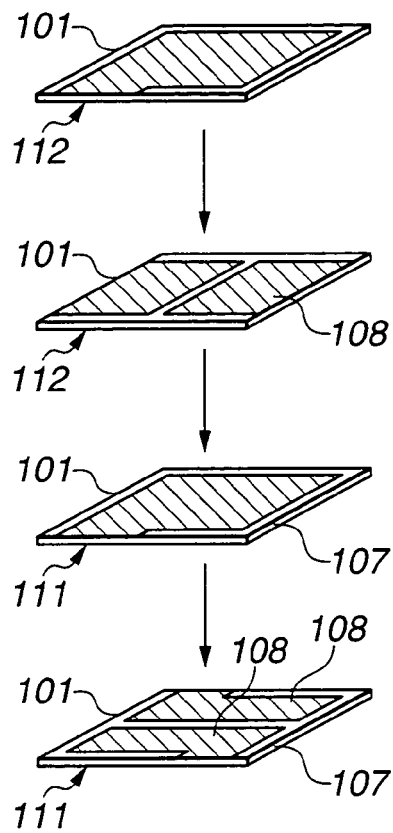
FIG. 14 is an exploded perspective view of a first layered product used in the ultrasonic transducer in FIG. 13, viewed from above.
Figure 15:
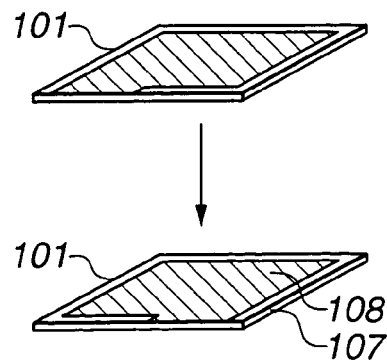
FIG. 15 is an exploded perspective view of a second layered product used in the ultrasonic transducer in FIG. 13, viewed from above.

An ultrasonic transducer according to a second embodiment of the present invention and an ultrasonic motor using the ultrasonic transducer will now be described with reference to FIGS. 11 and 12A to 12D. FIG. 11 is an exploded perspective view showing in detail the structure of internal electrodes in the ultrasonic transducer mounted in the ultrasonic motor. FIGS. 12A to 12C are diagrams schematically illustrating the structure of the ultrasonic transducer. FIG. 12A is a left-side view of the ultrasonic transducer. FIG. 12B is a front view of the ultrasonic transducer. FIG. 12C is a right-side view of the ultrasonic transducer. FIG. 12D is a rear (back) view of the ultrasonic transducer. The same reference numerals are used in FIGS. 11 and 12A to 12D to identify the same components as in the ultrasonic transducer of the first embodiment. The description of such components is omitted here and only the components different from those in the ultrasonic transducer of the first embodiment will be described.

According to the second embodiment, although the ultrasonic transducer has a prismatic shape, like the ultrasonic transducer of the first embodiment, it is characterized in that the ultrasonic transducer of the second embodiment differs in the layering direction from the ultrasonic transducer of the first embodiment. The size of the ultrasonic transducer of the second embodiment is substantially the same as that of ultrasonic transducer of the first embodiment.

Referring to FIG. 11, a layered product 1E of the ultrasonic transducer according to the second embodiment has a structure in which first piezoelectric sheets 22A to 22C and second piezoelectric sheets 21A to 21D are layered in a direction orthogonal to the direction of first longitudinal resonance of the layered product 1E.

In the layered product 1E of the ultrasonic transducer 1, as shown in FIG. 11, the three first piezoelectric sheets 22A to 22C, a plurality of rectangular second piezoelectric sheets 21A, a plurality of rectangular second piezoelectric sheet 22B, a plurality of rectangular second piezoelectric sheet 21C, and a plurality of rectangular second piezoelectric sheet 21D constitute the first layered part 2 and the second layered part 3. The three first piezoelectric sheets 22A to 22C serve as insulators and do not undergo electrode treatment. The plural rectangular second piezoelectric sheets 21A and 22B are sandwiched between the first piezoelectric sheet 22A and the first piezoelectric sheet 22B, are layered in the direction orthogonal to the direction of the first longitudinal resonance, and undergo internal electrode treatment. The plural rectangular second piezoelectric sheets 21C and 21D are sandwiched between the first piezoelectric sheet 22B and the first piezoelectric sheet 22C, are layered in the direction orthogonal to the direction of the first longitudinal resonance, and undergo internal electrode treatment.

Specifically, alternately layering the two kinds of second piezoelectric sheets 21A and 21B so as to be sandwiched between the first piezoelectric sheet 22A at the front of the layered product 1E and the first piezoelectric sheet 22B at the center of the layered product 1E constitutes the first layered part 2. Alternately layering the two kinds of second piezoelectric sheets 21C and 21D so as to be sandwiched between the first piezoelectric sheet 22B at the center of the layered product 1E and the first piezoelectric sheet 22C at the back of the layered product 1E constitutes the second layered part 3.

The first layered part 2 has a structure in which the second piezoelectric sheets 21A, each having a first internal electrode 23A formed thereon, and the second piezoelectric sheets 21B, each having a second internal electrode 24A formed thereon, are alternately layered in the layering direction described above.

The second layered part 3 has a structure in which the second piezoelectric sheets 21C, each having a third internal electrode 25A formed thereon, and the second piezoelectric sheets 21D, each having a fourth internal electrode 26A formed thereon, are alternately layered in the layering direction described above.

Each of the first to fourth internal electrodes 23A to 26A is substantially equally quadrisected with a clearance of around 500 μm on the corresponding second piezoelectric sheet. The quadrisected first to fourth internal electrodes 23A to 26A each have clearances of around 500 μm along the edges of the ultrasonic transducer, while the quadrisected first to fourth internal electrodes 23A to 26A each extend toward the edge of the ultrasonic transducer only at portions that are in contact with the corresponding outer electrodes. The first layered part 2 has the same structure of the internal electrodes as the second layered part 3.

The first piezoelectric sheets 22A to 22C each have a thickness of, for example, around 500 μm.

FIGS. 12A to 12D show the appearance of the layered product 1E having the structure in which the first piezoelectric sheets 22A to 22C and the second piezoelectric sheets 21A to 21D are layered in the manner described above.

The layered product 1E of the ultrasonic transducer according to the second embodiment has two kinds of A-phase outer electrodes (A+ and A−) 23B (25B) and 24B (26B), which are provided across the first layered part 2 and the second layered part 3, on the upper half of its left-side face, as shown in FIG. 12A.

The layered product 1E of the second embodiment has A1-phase outer electrodes (A1+ and A1−) 23B and 24B in the first layered part 2 and has B1-phase outer electrodes (B1+ and B1−) 25B and 26B in the second layered part 3, on the lower half of its left-side face.

The layered product 1E of the ultrasonic transducer according to the second embodiment has two kinds of B-phase outer electrodes (B+ and B−) 23B (25B) and 24B (26B), which are provided across the first layered part 2 and the second layered part 3, on the upper half of its right-side face, as shown in FIG. 12C.

The layered product 1E of the second embodiment has A1-phase outer electrodes (A1+ and A1−) 23B and 24B in the first layered part 2 and has B1-phase outer electrodes (B1+ and B1−) 25B and 26B in the second layered part 3, on the lower half of its right-side face.

The layered product 1E of the second embodiment has outer electrodes 4a and 4b for connecting the A1-phase outer electrodes (+ and −) on the lower half of its left-side face to the A1-phase outer electrodes (+ and −) on the lower half of its right-side face on the front face, as shown in FIG. 12B.

The layered product 1E of the second embodiment has outer electrodes 4c and 4d for connecting the B1-phase outer electrodes (+ and −) on the lower half of its left-side face to the B1-phase outer electrodes (+ and −) on the lower half of its right-side face on the rear face, as shown in FIG. 12D.

According to the second embodiment, the minus-side internal electrodes may not be divided to provide full electrodes, as in the first embodiment, although not shown.

The A-phase, B-phase, A1-phase, and B1-phase outer electrodes on the layered product 1E of the second embodiment correspond to the A-phase, B-phase, A1-phase, and B1-phase outer electrodes on the layered product 1A of the first embodiment, respectively.

Since the manufacturing process of the layered product 1E is the same as that of the layered product 1A of the first embodiment, the description of the manufacturing process according to the second embodiment is omitted.

Further, since the structure of the ultrasonic motor using the layered product 1E having the structure described above is also the same as in the first embodiment, the description of the structure of the ultrasonic motor according to the second embodiment is omitted.

Operation

The ultrasonic transducer having the layered product 1E of the second embodiment operates in the same manner as the ultrasonic transducer 1 of the first embodiment. The ultrasonic motor 20 in FIG. 4 or the ultrasonic motor 20A in FIG. 5 using the layered product 1E of the ultrasonic transducer of the second embodiment also operates in the same manner as the ultrasonic motor 20 or 20A using the layered product 1A of the ultrasonic transducer 1 of the first embodiment.

Advantages

As described above, according to the second embodiment, the first piezoelectric sheets 22A to 22C and the second piezoelectric sheets 21A to 21D are layered in the depth or lateral direction of 5 mm, thus reducing the number of the layered sheets. Since the layered product 1E can be formed by using one kind of shape of the internal electrodes, it is possible to achieve further reduction in the manufacturing cost and further simplification of the manufacturing process, compared with the layered product 1A of the first embodiment. Other advantages are the same as in the first embodiment.

The present invention is not limited to the first and second embodiments and the modifications. Combination or applications of the first and second embodiments and the modifications can also be applied to the present invention.

In this invention, it is apparent that various modifications different in a wide range can be made on this basis of this invention without departing from the spirit and scope of the invention. This invention is not restricted by any specific embodiment except being limited by the appended claims.

What is claimed is:

1. An ultrasonic transducer comprising:
   a first set of piezoelectric elements disposed as insulators,
      at least a first and a second piezoelectric element of the first set of piezoelectric elements respectively forming a top and a bottom of the ultrasonic transducer;

internal electrodes;

a plurality of second piezoelectric elements, the internal electrodes and the second piezoelectric elements being alternately layered;

outer electrodes, each being connected to the corresponding internal electrodes;

a first layered part including at least the internal electrodes, each being divided in half in a second direction orthogonal to a layering direction, which is a first direction;

a second layered part including at least the internal electrodes, each being divided in half in a third direction orthogonal to the first direction and the second direction, the first layered part and the second layered part being separated by at least a third piezoelectric element of the first set of piezoelectric elements;

a first outer-electrode group provided so as to be connected to predetermined internal electrodes in the first layered part; and a second outer-electrode group provided so as to be connected to predetermined internal electrodes in the second layered part, wherein applying alternating voltage to the first outer-electrode group excites longitudinal resonance in the first direction and flexural resonance in the third direction and/or applying alternating voltage to the second outer-electrode group excites the longitudinal resonance in the first direction and flexural resonance in the second direction to generate ultrasonic elliptical vibration in the ultrasonic transducer.

2. An ultrasonic transducer according to claim 1, further comprising a frictional member fixed at a position where the ultrasonic elliptical vibration is generated.

3. An ultrasonic transducer according to claim 2, wherein the frictional member has a projecting part.

4. An ultrasonic transducer comprising:

a first set of piezoelectric elements disposed as insulators, at least a first and a second piezoelectric element of the first set of piezoelectric elements respectively forming a top and a bottom of the ultrasonic transducer;

internal electrodes;

a plurality of second piezoelectric elements, the internal electrodes and the second piezoelectric elements being alternately layered;

outer electrodes, each being connected to the corresponding internal electrodes;

a first layered part and a second layered part including at least the internal electrodes, each being substantially equally quadrisected in a second direction orthogonal to a layering direction, which is a first direction, and in a third direction orthogonal to the first direction and the second direction, the first layered part and the second layered part being separated by at least a third piezoelectric element of the first set of piezoelectric elements;

a first outer-electrode group provided so as to be connected to predetermined internal electrodes in the first layered part and the second layered part;

a second outer-electrode group provided so as to be connected to predetermined internal electrodes in the first layered part; and a third outer-electrode group provided so as to be connected to predetermined internal electrodes in the second layered part, wherein applying alternating voltage to the first outer-electrode group excites longitudinal resonance in the second direction and flexural resonance in the third direction and/or applying alternating voltage to the second outer-electrode group and the third outer-electrode group excites the longitudinal resonance in the second direction and flexural resonance in the first direction to generate ultrasonic elliptical vibration in the ultrasonic transducer.

5. An ultrasonic transducer according to claim 4, further comprising a frictional member fixed at a position where the ultrasonic elliptical vibration is generated.

6. An ultrasonic transducer according to claim 5, wherein the frictional member has a projecting part.

7. An ultrasonic motor comprising at least: the ultrasonic transducer according to claim 1; and a driven body that is in contact with a position where the ultrasonic elliptical vibration is generated on the ultrasonic transducer to be driven in an arbitrary two-dimensional direction with respect to the ultrasonic transducer.

8. An ultrasonic motor according to claim 7, further comprising a frictional member fixed at the position where the ultrasonic elliptical vibration is generated.

9. An ultrasonic motor according to claim 8, wherein the frictional member has a projecting part.

10. An ultrasonic motor according to claim 7, wherein the driven body rotates with respect to the ultrasonic transducer.

11. An ultrasonic motor according to claim 7, wherein the driven body moves straight with respect to the ultrasonic transducer.

12. An ultrasonic motor according to claim 7, wherein the ultrasonic transducer is held in a casing of the ultrasonic motor by using a plurality of pins provided at substantial nodes of the longitudinal resonance and the flexural resonance generated by the ultrasonic transducer and wherein the driven body is supported by using pressing means so as to be in contact with the position where the ultrasonic elliptical vibration is generated by the ultrasonic transducer.

13. An ultrasonic motor comprising at least: the ultrasonic transducer according to claim 4; and a driven body that is in contact with a position where the ultrasonic elliptical vibration is generated on the ultrasonic transducer to be driven in an arbitrary two-dimensional direction with respect to the ultrasonic transducer.

14. An ultrasonic motor according to claim 13, further comprising a frictional member fixed at the position where the ultrasonic elliptical vibration is generated.

15. An ultrasonic motor according to claim 14, wherein the frictional member has a projecting part.

16. An ultrasonic motor according to claim 13, wherein the driven body rotates with respect to the ultrasonic transducer.

17. An ultrasonic motor according to claim 13, wherein the driven body moves straight with respect to the ultrasonic transducer.

18. An ultrasonic motor according to claim 13, wherein the ultrasonic transducer is held in a casing of the ultrasonic motor by using a plurality of pins provided at substantial nodes of the longitudinal resonance and the flexural resonance generated by the ultrasonic transducer and wherein the driven body is supported by using pressing means so as to be in contact with the position where the ultrasonic elliptical vibration is generated by the ultrasonic transducer.

* * * * *